United States Patent
Molnar et al.

(10) Patent No.: US 6,847,688 B1
(45) Date of Patent: Jan. 25, 2005

(54) AUTOMATIC FREQUENCY CONTROL SYSTEMS AND METHODS FOR JOINT DEMODULATION

(75) Inventors: Karl James Molnar, Cary, NC (US); Abdulrauf Hafeez, Cary, NC (US); Hüseyin Arslan, Morrisville, NC (US)

(73) Assignee: Ericsson Inc., Research Triangle Park, NC (US)

( * ) Notice: Subject to any disclaimer, the term of this patent is extended or adjusted under 35 U.S.C. 154(b) by 661 days.

(21) Appl. No.: 09/699,920

(22) Filed: Oct. 30, 2000

(51) Int. Cl.$^7$ ................................................ H04L 1/00
(52) U.S. Cl. ...................................................... 375/344
(58) Field of Search ................................. 375/316, 344, 375/345, 348, 356, 324, 362, 371, 376, 229, 340, 346; 370/324, 337, 347, 350, 904; 325/229, 344, 345, 346, 348, 340, 356, 362, 37 P; 455/139

(56) References Cited

U.S. PATENT DOCUMENTS

| | | | | | |
|---|---|---|---|---|---|
| 5,228,062 A | * | 7/1993 | Bingham | ...................... | 375/97 |
| 5,282,227 A | * | 1/1994 | Crawford | ...................... | 375/81 |
| 5,311,546 A | * | 5/1994 | Paik et al. | ..................... | 375/14 |

(List continued on next page.)

FOREIGN PATENT DOCUMENTS

| | | |
|---|---|---|
| EP | 0 936 749 | 8/1999 |
| WO | WO 00/13383 | 3/2000 |

OTHER PUBLICATIONS

Gooch et al., "Demodulation of Cochannel QAM Signals", International Conference on Acoustics, Speech, and Signal Processing 1989, May 23–26, 1989, vol. 2, pp. 1392–1395.*

(List continued on next page.)

Primary Examiner—Mohammed Ghayour
Assistant Examiner—Dung X. Nguyen
(74) Attorney, Agent, or Firm—Myers Bigel Sibley & Sajovec

(57) ABSTRACT

A joint demodulator is configured to generate an estimated first frequency or first frequency error for the first signal and an estimated second frequency or second frequency error for the second signal. A first long-term automatic frequency control is responsive to the estimated first frequency or first frequency error, wherein the joint demodulator is responsive to the first long-term automatic frequency control. A second long-term automatic frequency control is responsive to the estimated second frequency or second frequency error, wherein the joint demodulator is responsive to the second long-term automatic frequency control. First and second local automatic frequency controls also may be included in the joint demodulator, wherein the first long-term automatic frequency control is responsive to the first local automatic frequency control and the second long-term automatic frequency control is responsive to the second local automatic frequency control. The first long-term automatic frequency control and the second long-term automatic frequency control can produce respective first and second frequency offset signals that are applied to the joint demodulator. Alternatively, a difference between the first and second frequency offsets is applied to the joint demodulator and the first frequency offset is applied to a downconverter that downconverts the jointly received first and second signals and provides the downconverted signals to the joint demodulator.

44 Claims, 8 Drawing Sheets

U.S. PATENT DOCUMENTS

| | | | | |
|---|---|---|---|---|
| 5,321,850 | A | | 6/1994 | Bäckström et al. ......... 455/139 |
| 5,425,060 | A | * | 6/1995 | Roberts et al. ............. 375/371 |
| 5,440,268 | A | * | 8/1995 | Taga et al. .................. 329/308 |
| 5,471,508 | A | * | 11/1995 | Koslow ....................... 375/344 |
| 5,506,861 | A | | 4/1996 | Bottomley .................. 375/200 |
| 5,640,432 | A | | 6/1997 | Wales .......................... 375/346 |
| 5,734,639 | A | * | 3/1998 | Bustamante et al. ........ 370/208 |
| 5,771,224 | A | * | 6/1998 | Seki et al. ................... 370/206 |
| 5,828,710 | A | * | 10/1998 | Beale ........................... 375/344 |
| 5,872,815 | A | * | 2/1999 | Strolle et al. ................ 375/321 |
| 5,982,821 | A | * | 11/1999 | Kingston et al. ............ 375/326 |
| 5,987,074 | A | * | 11/1999 | Wakamatsu .................. 375/332 |
| 6,115,431 | A | * | 9/2000 | Lee .............................. 375/324 |
| 6,278,746 | B1 | * | 8/2001 | Velez et al. .................. 375/326 |
| 6,289,061 | B1 | * | 9/2001 | Kandala et al. ............. 375/344 |
| 6,359,944 | B1 | * | 3/2002 | Curtis, III et al. ........... 375/344 |
| 6,671,338 | B1 | * | 12/2003 | Gamal et al. ................ 375/346 |

OTHER PUBLICATIONS

Hafeez et al., *Co–Channel Interference Cancellation for D–AMPS Handsets,* Proceedings of the 49$^{th}$ IEEE Vehicular Technology Conference, May 1999, pp. 1026–1031.

Lo et al., *Adaptive Equalization and Interference Cancellation for Wireless Communication Systems,* IEEE Transactions on Communications, vol. 47, No. 4, Apr. 1999, pp. 538–545.

Murata et al., *Joint Frequency Offset and Delay Profile Estimation Technique for Nonlinear Co–channel Interference Canceller,* Proceedings of the PIMRC, Nov. 1998, pp. 486–490.

Molnar et al., *Adaptive Array Processing MLSE Receivers for TDMA Digital Cellular PCS Communications,* IEEE Journal on Selected Areas in Communications, vol. 16, No. 8, Oct. 1998, pp. 1340–1350.

Raheli et al., *Per–Survivor Processing: A General Approach to MLSE in Uncertain Environments,* IEEE Transactions on Communications, vol. 43, No. 2/3/4, Feb./Mar./Apr. 1995, pp. 354–364.

Chennakeshu et al., *Differential Detection of π/4–Shifted–DQPSK for Digital Cellular Radio,* IEEE Transactions on Vehicular Technology, vol. 42, No. 1, pp. 46–57, Feb. 1993.

U.S. patent application Ser. No. 09/143,821, Hafeez et al.

Lindsey et al., *A Survey of Digital Phase–Locked Loops,* Proceedings of the IEEE, vol. 69, No. 4, Apr. 1981, pp. 410–431.

Arslan et al., *Adjacent Channel Interference Suppression in FDMA/TDMA Mobile Radio Systems Using Joint Demodulation,* IEEE International Conference on Atlanta, GA, Jun. 7–11, 1998, p. 723–727.

Murata et al., *Joint Frequency Offset and Delay Profile Estimation Technique for Nonlinear Co–channel Interference Canceller,* The Ninth IEEE International Symposium on Boston, MA, Sep. 8–11, 1998, pp. 486–490.

International Search Report, PCT/US01/46721, Aug. 30, 2002.

Hamkins, *An Analytic Technique to Separate Cochannel FM Signals,* IEEE Transactions on Communications, vol. 48, No. 4, Apr. 2000, pp. 543–546.

Paparisto et al., *A Single–Packet Method for Adaptive Maximum Likelihood CCI Identification and Mitigation,* Global Telecommunications Conference–Globcom '99, General Conference (Part A), 1999, pp. 492–496.

Hamkins, *Cochannel FM Signal Separation,* Information Theory Workshop 1998, San Diego, CA, Feb. 8–11, 1998, 1 p.

Hamkins, *A Joint Viterbi Algorithm to Separate Cochannel FM Signals,* International Conference on Acoustics, Speech, and Signal Processing (ICASSP), vol. 6, 1998, pp. 3297–3300.

Hamkins et al., *A Comparative Study of Co–Channel Interference Suppression Techniques,* Proceedings of the Fifth International Mobile Satellite Conference, Jun. 1997, pp. 327–332.

Esteves et al., *A Per–Survivor Phase Acquisition and Tracking Algorithm for Detection of TCM Signals With Phase Jitter and Frequency Error,* IEEE Transactions on Communications, vol. 45, No. 11, Nov. 1997, pp. 1381–1384.

D'Andrea et al., *Approximate ML Decoding of Coded PSK With No Explicit Carrier Phase Reference,* IEEE Transactions on Communications, vol. 42, No. 2/3/4, Feb./Mar./Apr. 1994, pp. 1033–1039.

* cited by examiner

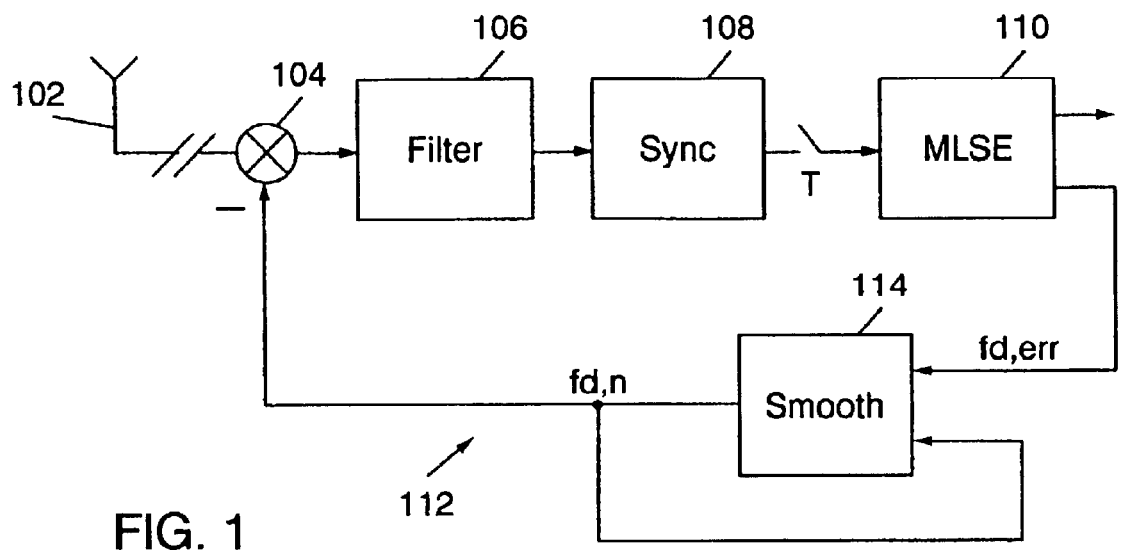
FIG. 1
PRIOR ART
FIG. 2
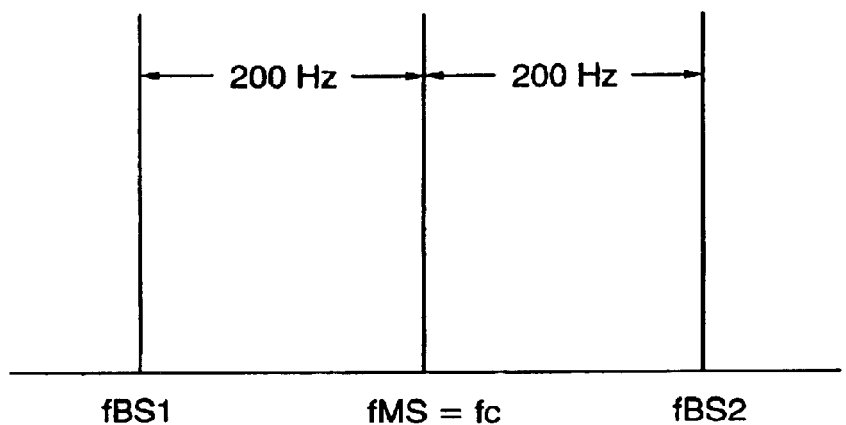

AUTOMATIC FREQUENCY CONTROL SYSTEMS AND METHODS FOR JOINT DEMODULATION

BACKGROUND OF THE INVENTION

This invention relates to digital communications, and more particularly to systems and methods for jointly demodulating a received signal.

Joint demodulation is widely used to detect two or more signals that are received over a common channel. For example, joint demodulation may be used to detect a desired signal from a received signal that includes an interfering signal as well. In joint demodulation, the desired signal and the interfering signal are both demodulated based on information concerning the desired signal and the interfering signal, so as to obtain a better estimate of the desired signal.

Two-user joint demodulation for IS-136 TDMA wireless communication terminals has been proposed for cancellation of a dominant interfering signal, also referred to as an "interferer", under the assumptions of a flat, slow fading downlink environment. By subtracting off the interfering signal, the desired signal's bit error-rate can be improved. This occurs since both the channel and symbol data corresponding to the interferer generally are not perfectly correlated to the desired signal, allowing separation of the two signals. Joint demodulation thus may rely upon the ability to estimate the channel and perform symbol detection for each user across the data slot.

For the joint demodulation approach used for the IS-136 system, estimation of the initial channel response generally is performed in the same manner as in conventional single-user demodulation since the synchronization (sync) sequence for the desired signal is known. However, since the interferer sync word generally is unknown, a semi-blind technique may be used to find an estimate of the sample-position offset and the initial channel response of the interferer. Joint detection of the two users' symbol data then may be performed, for example using per-survivor processing using LMS tracking of the channel responses for each user.

A concern in the implementation of joint demodulation is the impact that frequency offset of the users' signals will have on the ability to cancel interference. In single-user demodulation, the carrier frequency of the received signal may be offset from the assumed carrier frequency, for example due to the limited tolerance of the oscillators in the base station and/or wireless terminal. Correcting for this frequency offset is typically a two-step Automatic Frequency Control (AFC) process, that includes initial frequency acquisition and frequency tracking. Frequency tracking can estimate and track the residual frequency offset that remains after initial frequency acquisition, and itself may be a two-step process including long term AFC and local (short term) AFC estimation.

SUMMARY OF THE INVENTION

Embodiments of the present invention can provide systems and methods for jointly demodulating jointly received first and second signals, wherein a joint demodulator is configured to generate an estimated first frequency or first frequency error for the first signal and an estimated second frequency or second frequency error for the second signal. A first long-term automatic frequency control is responsive to the estimated first frequency or first frequency error, wherein the joint demodulator is responsive to the first long-term automatic frequency control. A second long-term automatic frequency control is responsive to the estimated second frequency or second frequency error, wherein the joint demodulator is responsive to the second long-term automatic frequency control. First and second local automatic frequency controls also may be included in the joint demodulator, wherein the first long-term automatic frequency control is responsive to the first local automatic frequency control and the second long-term automatic frequency control is responsive to the second local automatic frequency control.

In some embodiments, the first long-term automatic frequency control and the second long-term automatic frequency control produce respective first and second frequency offset signals that are applied to the joint demodulator. In other embodiments, a difference between the first and second frequency offsets is applied to the joint demodulator and the first frequency offset is applied to a downconverter that downconverts the jointly received first and second signals and provides the downconverted signals to the joint demodulator. Thus, in these embodiments, the frequency offset of the desired signal is used to correct the incoming signal at the local oscillator of the downconverter.

BRIEF DESCRIPTION OF THE DRAWINGS

FIG. 1 is a block diagram of a conventional long term AFC loop.

FIG. 2 graphically illustrates relative frequency offset of an interferer according to embodiments of the present invention.

DETAILED DESCRIPTION OF THE INVENTION

Figure 3:
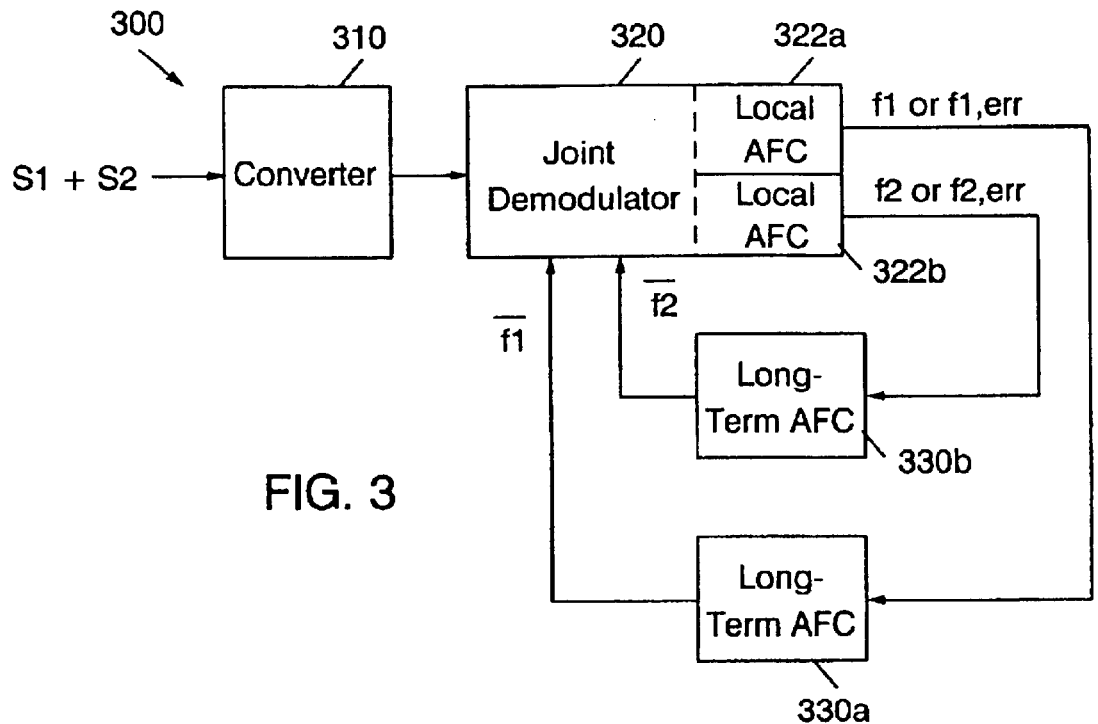
FIGS. 3 and 4 are block diagrams of alternate embodiments of joint demodulation systems and methods according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present.

A block diagram of a long term AFC loop for a single-user detector is shown in FIG. 1. As shown in FIG. 1, a received signal is received at an antenna 102 and is downconverted by converter 104. The signal then may be filtered by a filter 106, passed through an analog-to-digital converter, sampled and sent to a synchronizer 108. The signal can be sampled once per symbol or multiple times per symbol, as in the IS-136 standard.

The synchronizer 108 synchronizes the signal and can further sample the output signal at a rate to be processed by a detector using one or more samples per symbol. In this embodiment, the detector 110 is a Maximum Likelihood Sequence Estimator (MLSE) which provides a demodulated output signal. In addition, a long term AFC loop 112 is responsive to a frequency error signal $f_{d,err}$, applied to a smoothing filter 114 to generate a frequency precorrection signal $f_{d,n}$ that is applied to the next data slot at the converter 104.

For joint demodulation at a wireless terminal, the frequency offset for multiple users may arise from the different base stations that transmit the users' signals. For joint demodulation of a desired signal and an interfering signal, the frequency offset may arise due to frequency offsets between the desired signal and the interfering signal. Assume that coarse frequency acquisition has been performed with respect to the desired signal's base station. Further, assume that a residual frequency error of ±200 Hz exists between the base station carrier and the true carrier frequency, and that the mobile terminal can lock to within ±200 Hz with respect to the desired base station carrier frequency after coarse acquisition. Under these assumptions, the maximum frequency errors from the mobile to the desired and interfering base stations are ±200 Hz and ±600 Hz, respectively.

One approach for compensation of frequency offsets together with joint demodulation is described in Murata et al., Joint Frequency Offset and Delay Profile Estimation Technique for Nonlinear Co-Channel Interference Canceller, Proc. PIMRC, November 1998, pp. 486–490. Murata et al. describes a slot-aligned TDMA system where all users' sync sequences are known. The sync sequences are used in training mode to estimate the frequency offsets for each user jointly, and these frequency estimates are then fixed for the subsequent demodulation across the unknown data burst.

The joint AFC approach used in the Murata et al. publication appears to be similar to the single-user AFC approach described above. However, it may not perform adequately for semi-blind joint demodulation. In particular, the desired signal frequency is not used to precorrect the local oscillator frequency prior to synchronization or demodulation. This correction may be desirable if the corrected receive frequency is used as a reference for the transmit frequency, as is true for many IS-136 wireless terminals.

Moreover, in the Murata et al. publication, the frequency offsets are estimated directly over the sync sequence and then applied as a phase correction to the hypothesized signal in the metric when demodulating the data burst. Since frequency is the derivative of phase, it may be a noisy estimate, and a phase tracker may need to be used. Finally, in a semi-blind joint demodulation approach, the sync sequence for the interferer is unknown. Thus, both the channel and frequency estimates of the interferer are not very reliable after training. Instead of fixing the frequency estimate for data demodulation, it would be desirable to track it instead. Unfortunately, AFC loops, in general, are designed for tracking small frequency errors. Thus, it may be preferred to track the residual frequency error, i.e., the difference between the estimated frequency offset and the true frequency offset.

Embodiments according to the present invention now will be described. These embodiments can assume that the precorrection of the frequency for the desired signal is performed prior to filtering and synchronization. This impacts the relative frequency offset of the second signal, such as an interfering signal, also referred to as an "interferer", to a converter such as a local oscillator (LO) at the receiver.

For example, as shown in FIG. 2, a wireless terminal, also referred to as a mobile station (MS), has a 200 Hz offset from transmitters such as base stations BS1 (desired) and BS2 (interferer). If the mobile station corrects its frequency to align itself with BS1, then it may be 400 Hz offset from BS2. When the frequency correction is applied, then $f_{BS2}-f_{BS1}$ the frequency offset from the mobile station to the interferer, when $f_{MS}$ becomes $f_{BS1}$. In estimating the frequency offsets directly, this may present a problem since the offsets change relative to the mobile carrier $f_{MS}$.

Instead, according to embodiments of the invention, an estimate of the frequency offsets relative to a reference is obtained, so that the fixed frequency offset need not change after applying the frequency precorrection. Additionally, in the MLSE, it may be desired to track the residual frequency error as this will, hopefully, be small after some settling time. To do this, embodiments of the invention may account for the fixed-frequency terms in the MLSE metric and channel estimator.

Referring now to FIG. 3, first embodiments of systems and methods 300 for demodulating jointly received first and second signals according to the present invention, now will be described. As shown in FIG. 3, a converter 310, such as a baseband converter or baseband demodulator, is configured to downconvert jointly received first and second signals S1 and S2. A joint demodulator 320 is responsive to the downconverted, jointly received first and second signals, and is configured to separately generate an estimated first frequency f1 or an estimated first frequency error f1,err for the downconverted first signal, and an estimated second frequency f2 or an estimated second frequency error f2,err for the downconverted second signal. As shown in FIG. 3, the joint demodulator 320 may include a first local AFC 322a and a second local AFC 322b that may be used to generate the first frequency/first frequency error and the second frequency/second frequency error, respectively.

Still referring to FIG. 3, a first long-term automatic frequency control 330a is responsive to the first frequency/first frequency error, to generate a first frequency offset $\overline{f1}$ that is applied to the joint demodulator 320. A second long-term automatic frequency control 330b is responsive to the second frequency/second frequency error, to generate a second frequency offset $\overline{f2}$ that is applied to the joint demodulator. Thus, the joint demodulator is responsive to both the estimated second frequency/second frequency error and the estimated first frequency/first frequency error, to jointly demodulate the downconverted jointly received first and second signals.

Figure 4:
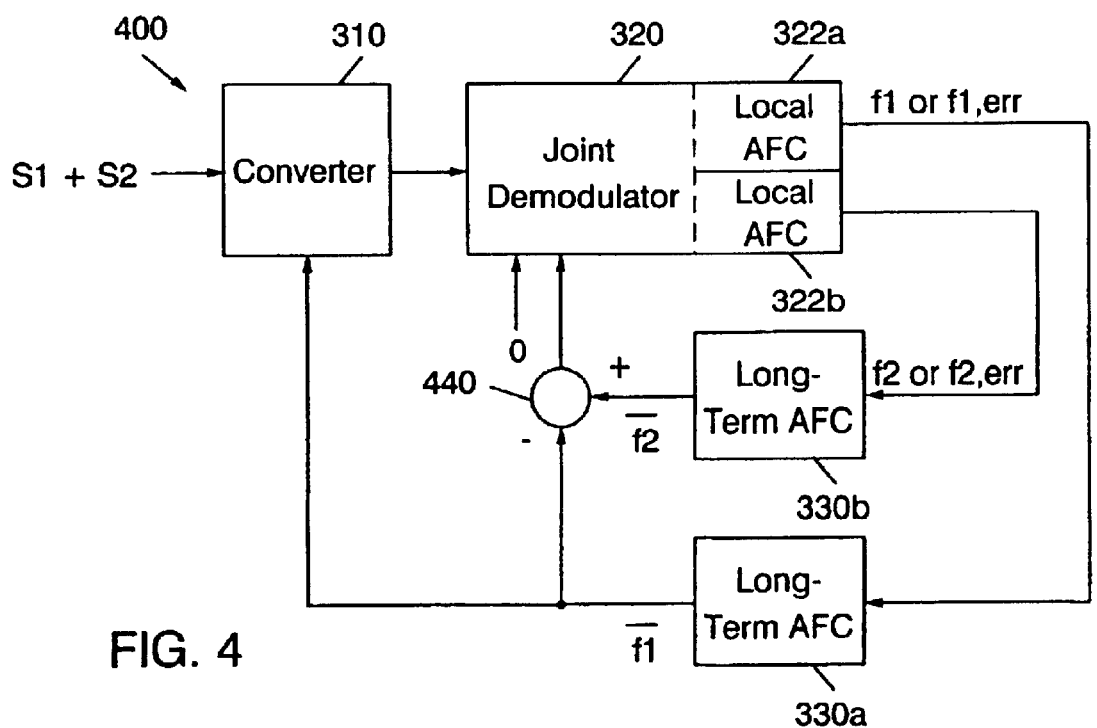

Referring now to FIG. 4, second embodiments of systems and methods 400 for demodulating jointly received first and second signals are shown. As shown in FIG. 4, a converter 310, a joint demodulator 320 including first local AFC 322a and second local AFC 322b and first and second long-term AFC 330a and 330b respectively can operate as was described above in connection with FIG. 3. In FIG. 4, a subtractor 440 also is provided, wherein the difference between the first frequency offset $\overline{f1}$ and the second frequency offset $\overline{f2}$ is generated and applied to the joint demodulator 320. In these embodiments, the joint demodulator assumes that there is no first frequency error, as illustrated in FIG. 4.

Additional discussion of the embodiments of FIGS. 3 and 4 now will be provided. In embodiments of the invention, the first signal S1 may be a desired signal and the second signal S2 may be an interfering signal. Moreover, the jointly received first and second signals may be received over a series of repeating slots and are sampled more than once during each slot. The local AFC 322a and 322b can operate at a first rate and the long-term AFC 330a and 330b can operate at a second rate that is lower than the first rate. In some embodiments, the first rate is once per sample, and the second rate is once per slot. The outputs from the local AFC 322a and 322b can be either an estimate of the frequency offset or an estimate of the error in the frequency offset. The long-term AFC 330a, 330b can be configured to handle either kind of estimate from the input. A fixed frequency term can be input to the local AFC 322a, 322b, so that the local AFC only estimates the error frequency.

In FIG. 4, the desired signal's frequency estimate $\overline{f1}$ can be sent to the local oscillator in the converter 310, to correct the signal prior to demodulation. Alternatively, in embodiments of FIG. 3, the desired signal's frequency offset $\overline{f1}$ can be sent directly to the joint demodulator.

Figure 5:
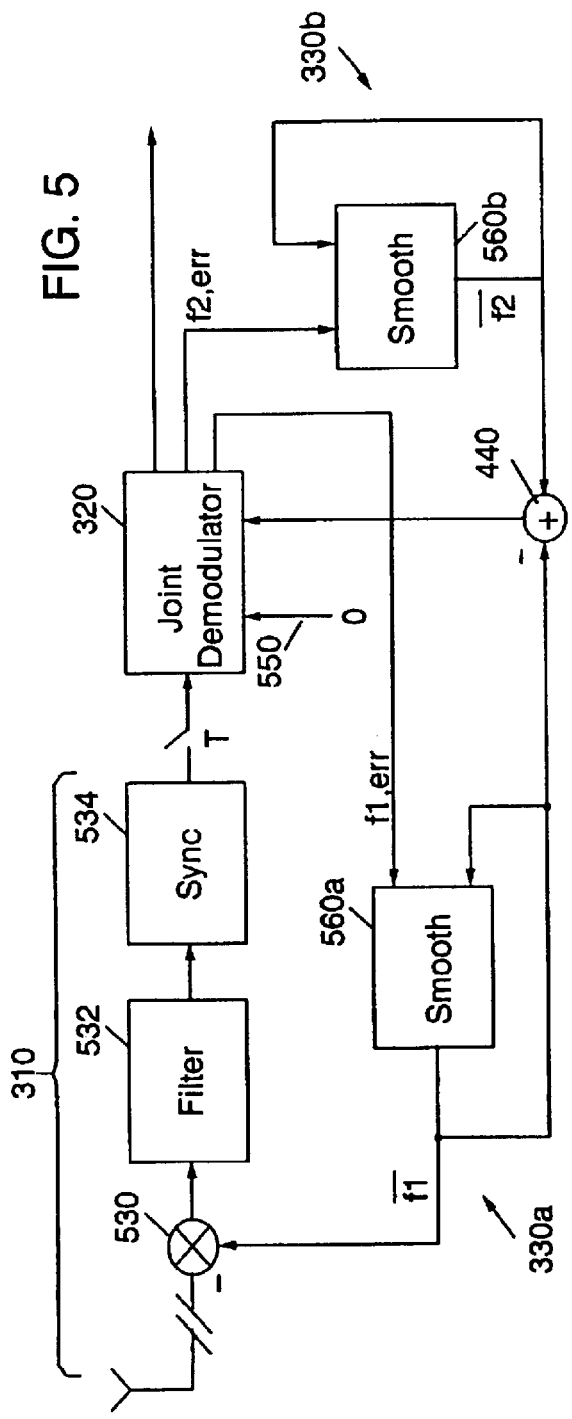
FIG. 5 is a block diagram of embodiments of systems and methods for long term AFC for two user joint demodulation according to the present invention.

FIG. 5 is a block diagram of other embodiments of joint demodulation systems and methods according to the invention. Referring to FIG. 5, the joint demodulator 320 outputs estimates of the residual frequency errors f1,err and f2,err for each user after demodulating a slot of data. These residual error estimates each are input to long term AFC loops 330a, 330b, each of which includes a smoothing filter 560a, 560b, to calculate the total frequency offset for each user. The desired signal frequency offset $\overline{f1}$ is applied to the local oscillator 530 of the converter 310 while the difference $\overline{f2}-\overline{f1}$ from summer 440 is applied to the joint demodulator 320 as the initial frequency offset for the interferer. Also shown explicitly is that zero frequency offset 550 is input to the joint demodulator 320 as the initial frequency offset for the desired signal. A conventional filter 532 and synchronizer 534 also are used in the converter 310. The smoothers 560a, 560b operate as the long term AFC 330a, 330b, when connected as shown.

A description of metric computation and channel estimation for joint demodulation in the joint demodulator 320 now will be described. For the two-user case with symbol-spaced receive samples, the receive signal is modeled at the lth sample using $$y_l = \hat{y}_{1,l} e^{j\phi_{1,err}} + \hat{y}_{2,l} e^{j\phi_{2,err}}, \qquad (1)$$

where the terms $\phi_{1,err}$ and $\phi_{2,err}$ represent the phase error for the desired and interfering users, respectively, given that the phase has been estimated and corrected up through time l. The term $\hat{y}_{i,l}$ is the hypothesized receive signal for user i precorrected up to sample l, and is given by $$\hat{y}_{i,l} = \sum_{k=0}^{K_i-1} c_{i,k,1} s_{i,1-k} e^{-j2\pi f_i l T_s} e^{j\phi_{i,1}},$$

$$= e^{j2\pi f_i l T_s} e^{j\phi_{i,1}} c_{i,1}^T s_{i,1} \qquad (2)$$

where $K_i$ is the number of dispersive taps for user i. The hypothesized signal contains the fixed frequency component $f_i$ for each user, which does not vary across the slot. Alternatively, the fixed frequency component $f_i$ can be set to zero and incorporated as the initial value of the frequency component of the second order phase-locked loop. The adaptive phase error term $\phi_{i,l}$ is the phase correction applied after demodulating the (l−1)st receive sample. Assume that this phase error is modeled by a second-order digital phase-locked loop, as in the single-user case, so that residual frequency error can be estimated for each user. The objective is then to determine how to calculate the phase error terms $\phi_{i,err}$ for users i=1 and i=2, which are then used to form the updated phase corrections $\phi_{i,l+1}$.

Figure 6:
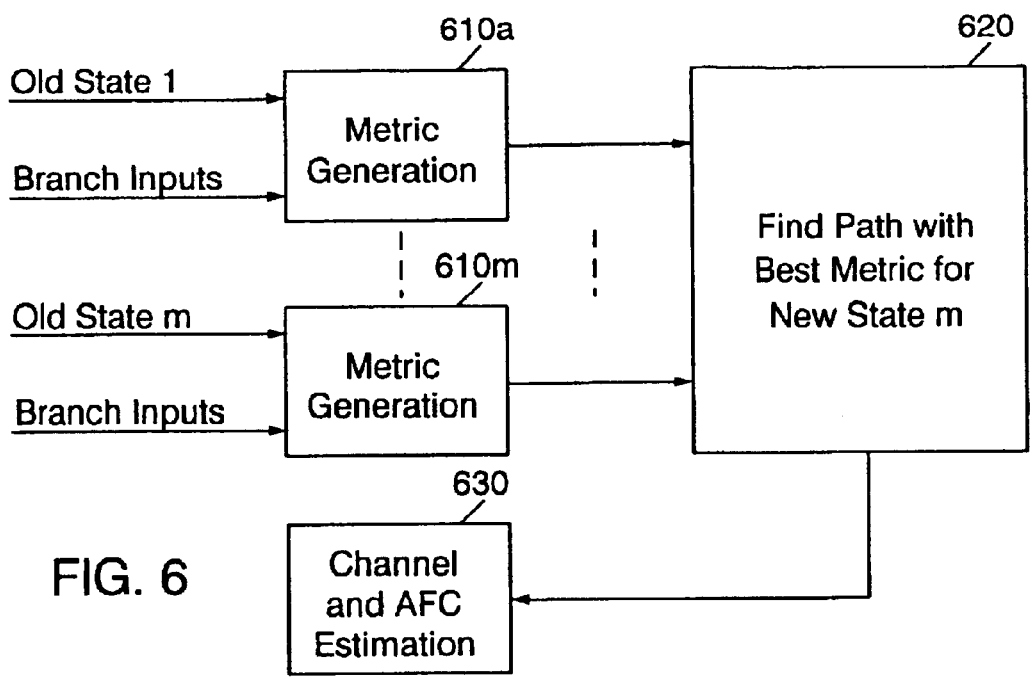
FIG. 6 is a block diagram of embodiments of PSP MLSE according to embodiments of the present invention.
Figure 7:
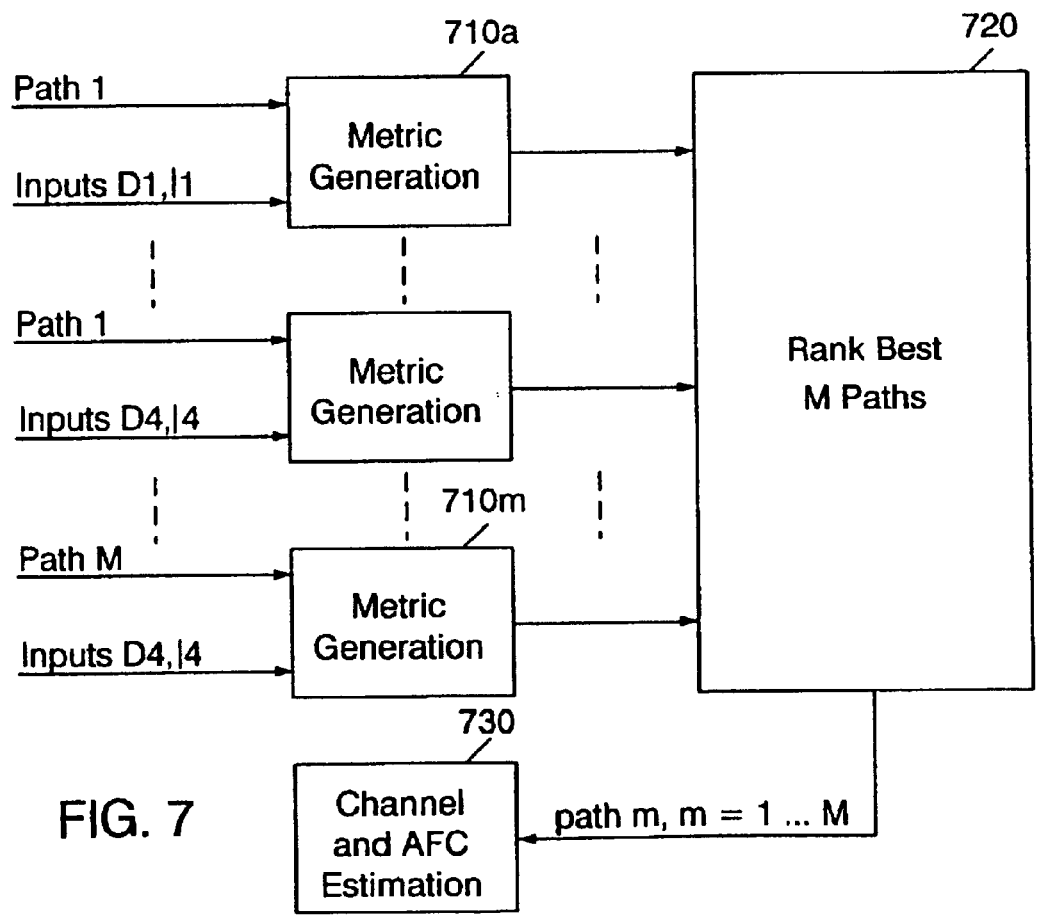
FIG. 7 is a block diagram of multiple survivor MLSE according to embodiments of the present invention.

Both Per Survivor Processing (PSP) and multiple-survivor MLSE may be used for joint demodulation. In each case, branch metrics are generated for hypothesized paths in the MLSE trellis. For PSP-MLSE, as shown in FIG. 6, the path corresponding to the best total accumulated metric 610a–610m at the input of each new state is declared a surviving path at block 620. For multiple-survivor MLSE with QPSK signaling, as shown in FIG. 7, the accumulated metrics 710a–710m are ranked at block 720 and the M paths with the best metrics survive to be further propagated. In each case, the channel and AFC estimates are updated for the surviving states or paths at block 630 and 730, respectively.

Figure 8:
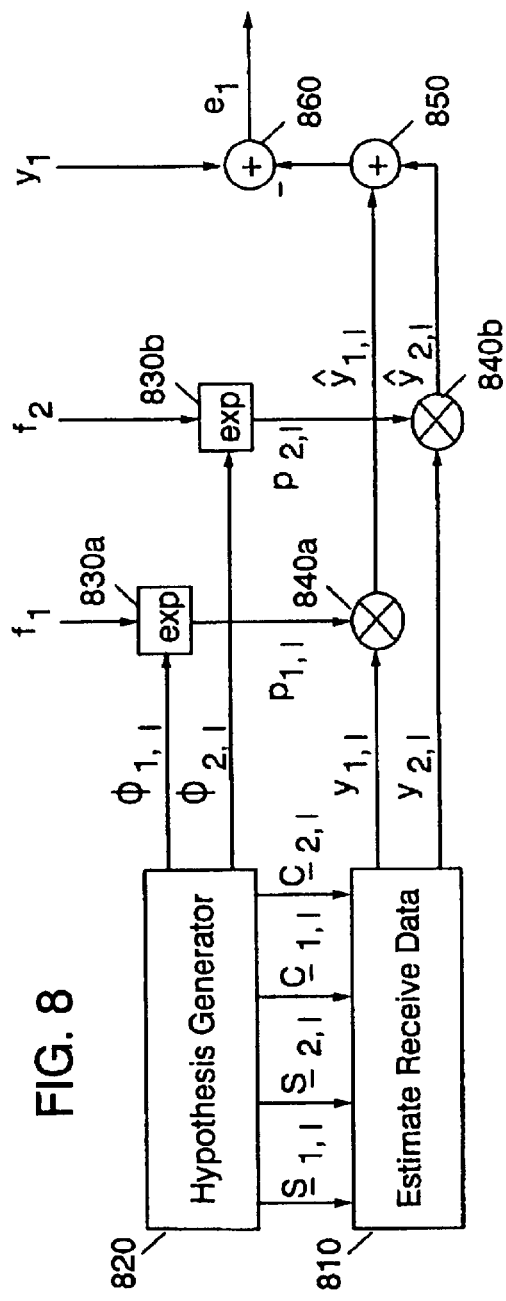
FIG. 8 is a block diagram of metric calculation for two user joint demodulation according to embodiments of the present invention.

Embodiments of metric generation, for example blocks 610 and 710 of FIGS. 6 and 7, respectively, now will be described in FIG. 8. For each new branch from an existing state (path), the error value $e_l$ is computed. First, the symbol data and channel data are used at block 810 to calculate the signals $y_{i,l}=C_{i,l}^T S_{i,l}$ for each user i ∈ {1,2}, corresponding to the receive signal in the absence of frequency error. Next, the fixed frequency error term $f_i$ is combined at blocks 830a and 830b with the most recent phase correction term $\phi_{i,l}$ from block 820, and this is used to rotate $y_{i,l}$ in the complex plane, forming $\hat{y}_{i,l}$ using blocks 840a and 840b. The error term is then formed using blocks 850 and 860 which is used to compute the branch metric. The term $p_{i,l}$ represents the complex rotation performed on $y_{i,l}$ and is given as $$p_{i,j} = e^{j2\pi f_i l T_s} e^{j\phi_{i,j}}. \qquad (3)$$

Certain variables may be temporarily saved at this point for each best path so that they may be used in the subsequent channel or AFC update. The terms $e_l$, $p_{i,l}$, $s_{i,l}$ may be saved for performing the channel update, while $\hat{y}_{i,l}$ may be saved for performing the AFC update. Note, that in U.S. patent application Ser. No. 09/143,821 to Hafeez et al. entitled Methods And Systems for Reducing Co-Channel Interference Using Multiple Timings For A Received Signal, $s_{i,l}$ may correspond to the symbol information filtered by a known pulse-shape and may not be the symbol data itself (which is why it should be saved). Also preferably saved as part of the traditional PSP-MLSE or MS-MLSE is the symbol history, channel and phase error states that get propagated for each surviving path.

Figure 9:
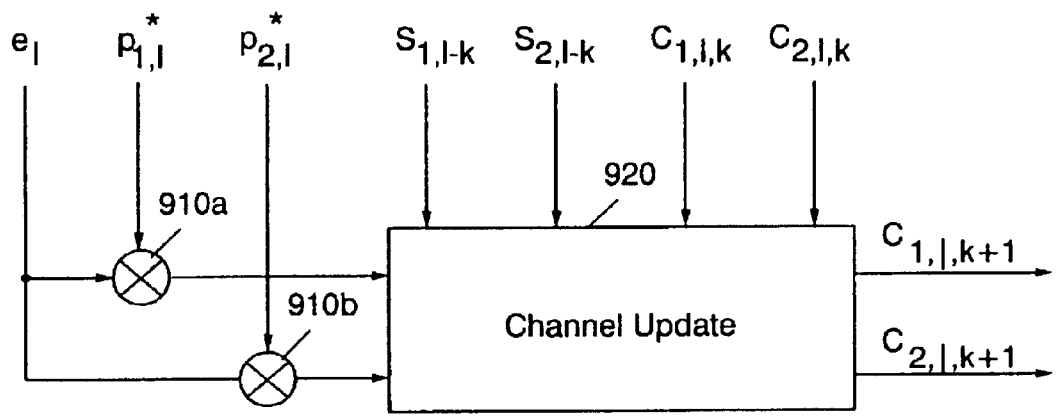
FIG. 9 is a block diagram of channel estimation for two user joint demodulation according to the present invention.

The channel update can then be performed for two-user joint demodulation as shown in FIG. 9, using the temporarily saved path variables described above. The phase correction term is applied to the error signal at blocks 910a and 910b, which is common to each channel update block 920, for a single user. Additionally, for the metric calculation, the phase correction is applied to $y_{i,l}$, rather than the symbol data. Performing the phase correction in this manner may use fewer operations than the approach used in the Murata et al. publication, where symbol values may need to be rotated for each possible branch metric in the trellis.

Local AFC for joint demodulation according to embodiments of the invention now will be described. The update may be determined for calculating the phase error terms to be used in the AFC loop. Equation (4) describes the received sample after frequency correction, where the residual phase errors $\phi_{1,err}$ and $\phi_{2,err}$ are to be found. In order to find these phase errors, the following metric may be used:

$$\gamma = -1/N|y_l - \hat{y}_l^T w_l^*|^2, \quad (4)$$

assuming zero-mean AWGN noise and no further interference. The terms $\hat{y}_l^T = [\hat{y}_{1,l}\ \hat{y}_{2,l}]$ and $w_l^* = [e^{j\phi_{1,err}}\ e^{j\phi_{2,err}}]^T$. Then, expanding $\gamma$ gives $$\gamma = -|y_l|^2 + 2Re\{y_l^* \hat{y}_l^T w_l\} + |\hat{y}_l^T|^2$$

An equivalent metric for $\gamma$ is $$= -2Re\{y_l^* \hat{y}_{1,l} e^{j\phi_{1,err}} + y_l^* \hat{y}_{2,l} e^{j\phi_{2,err}} - \hat{y}_{1,l} \hat{y}_{2,l}^* e^{j(\phi_{1,err} - \phi_{2,err})}\} \quad (5)$$

If an estimate is made of $\phi_{1,err}$, with $\phi_{2,err}$ fixed, $\gamma$ can be maximized using only those terms containing $\phi_{1,err}$. Thus, $$\hat{\phi}_{1,err} = \arg\max_{\phi_{1,err}} \gamma \quad (6)$$

$$= \arg\max_{\phi_{1,err}} Re\{e^{j\phi_{1,err}} \hat{y}_{1,l}[\hat{y}_l - \hat{y}_{2,l} e^{-j\phi_{2,err}}]\}$$

To maximize this quantity, $\phi_{1,err}$ may be chosen such that $$\hat{\phi}_{1,err} = \arg\{\hat{y}_{1,l}^*[y_l - \hat{y}_{2,l} e^{j\phi_{2,err}}]\}. \quad (7)$$

A similar approach may be used to find an estimate for $\phi_{2,err}$, and results in $$\hat{\phi}_{2,err} = \arg\{\hat{y}_{2,l}^*[y_l - \hat{y}_{1,l} e^{j\phi_{1,err}}]\}. \quad (8)$$

Figure 10:
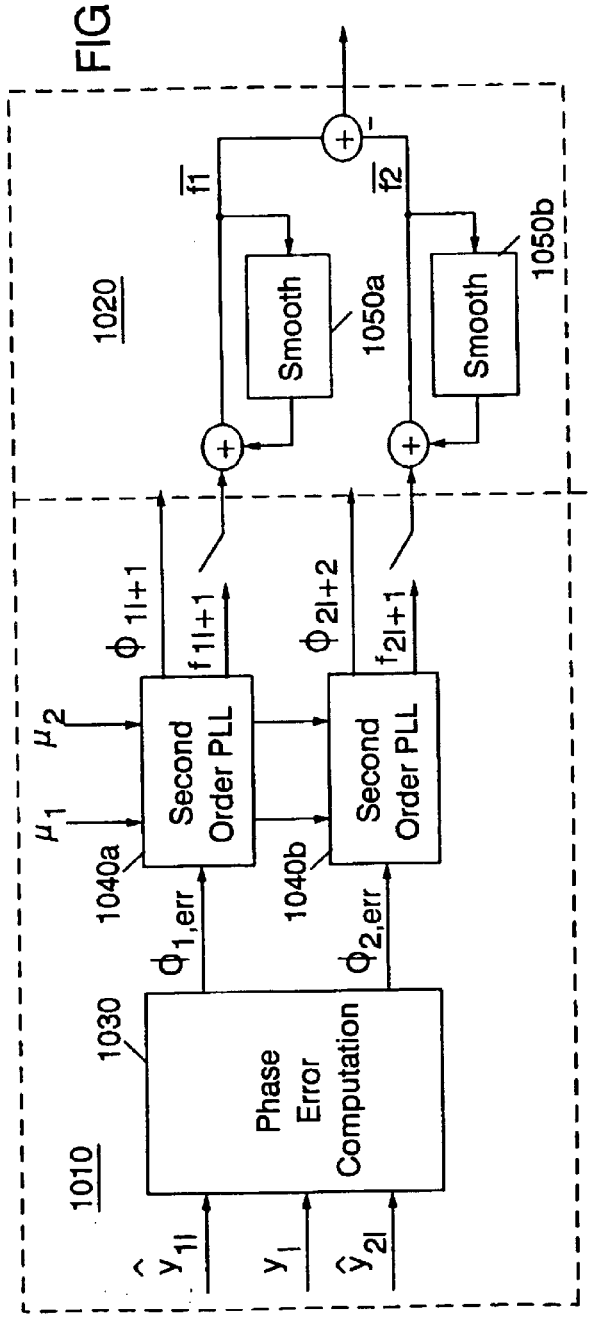
FIG. 10 is a block diagram of local and long term AFC for two user joint demodulation according to embodiments of the present invention.

FIG. 10 is a block diagram of embodiments of local AFC 1010 combined with embodiments of long-term AFC 1020 for a two-user case, where user one is the desired user and user two is the interferer. The output of the local AFC 1010 may be used in the equalizer, but is also output to the long-term AFC 1020. The local AFC output can optionally be sampled at a lower rate, which is then input to the long term AFC block.

More specifically, as shown in FIG. 10, embodiments of local AFC 1010 include a phase error computation block 1030 that is configured to compute a first phase error in the first received signal and a second phase error in the second received signal based, for example, on the outputs of an MLSE. One or more second order phase locked loops 1040a and 1040b also may be provided. The first phase locked loop 1040a is responsive to the first phase error, to compute a first frequency error. The second phase locked loop 1040b is responsive to the second phase error, to compute a second frequency error therefrom. These frequency errors then are provided to the long term AFC block 1020, wherein smoothing blocks 1050a, 1050b operate as was already described.

Figure 11:
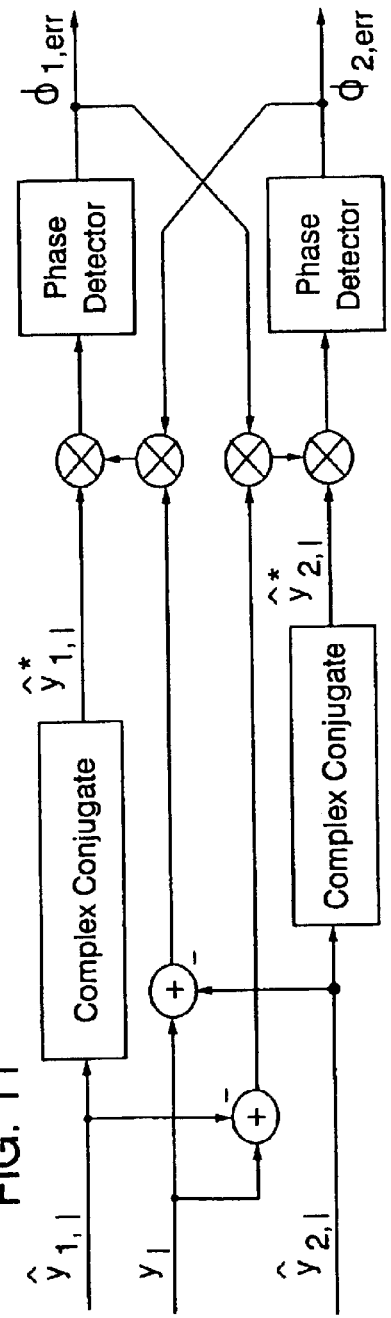
FIG. 11 is a block diagram of phase error computation for two user joint demodulation according to embodiments of the present invention.

FIG. 11 is a block diagram of phase error computation, for example block 1030 of FIG. 10, according to embodiments of the present invention. The phase error computation of FIG. 11 generates the phase errors that are described above by Equations (7) and (8). As can be seen, each phase error estimate is used to update the other phase error estimate using a feedback process, as shown in FIG. 10. Other embodiments for performing or replacing this feedback will be described below.

Figure 12:
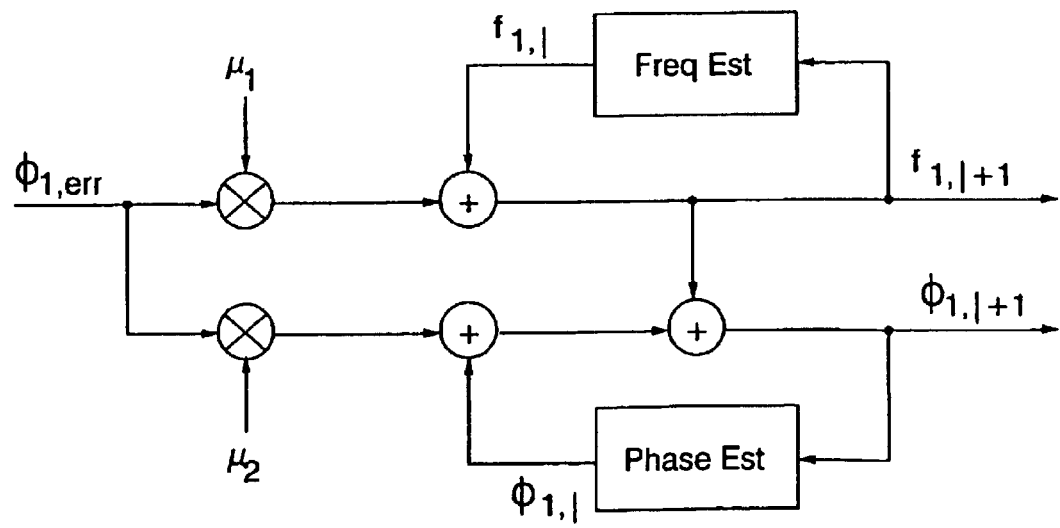
FIG. 12 is a block diagram of second order phase lock loops that can be used for joint demodulation according to embodiments of the present invention.

FIG. 12 is a block diagram of second order phase locked loops, such as second order phase locked loops 1040a and 1040b of FIG. 10, according to embodiments of the invention. Second order phase locked loops are well known to those having skill in the art and need not be described further herein.

Embodiments of the above-described local two-user AFC techniques, for example as shown in FIGS. 10–12 use the estimate for $\hat{\phi}_{1,err}$ to compute $\phi_{2,err}$. To avoid this interdependence on the estimates, the term $\phi_{2,err}$ may be dropped from the estimate, resulting in a form similar to that used in the Murata et al. publication.

Other embodiments can drop the feedback phase error terms from the second user when generating the phase error for the first user. Then, the phase error term for the first user can be fed back to generate the phase error for the second user, and so on for additional users.

After the phase error terms are computed for all users, the process may be repeated. Now, the phase error estimates are available from the first iteration (of phase error computation). For example, in other embodiments, the local AFC described in FIGS. 10–12 may be iterated one or more times, using the newly computed phase error terms as the feedback phase errors in FIG. 11.

Embodiments that can eliminate this dependence (and can eliminate the feedback phase error terms), jointly estimate both phase errors simultaneously. To do this, the metric from Equation (4) is negated:

$$\gamma = 1/N|y_l - \hat{y}_l^T w_l^*|^2, \quad (9)$$

and the weight vector $w_l^*$ that minimizes this metric is found. To perform this operation, the gradient is computed to get $$\nabla_{w_l} \gamma = 1/N[-\hat{y}_l^*(y_l - \hat{y}_l^T w_l^*)]. \quad (10)$$

Setting this to zero results in the set of linear equations $R_l w_l^* = p_l$ where $R_l = \hat{y}_l^* \hat{y}_l^T$ and $p_l = \hat{y}_l^* y_l$. However, for the two-user symbol-spaced case, this system generally is underdetermined. In general, the pseudo-inverse $R^+$ may be used to solve an overdetermined or underdetermined system of equations, and for the underdetermined case $R^+ = R^H (RR^H)^{-1}$. Once $w_l^*$ is found then $(\phi_{1,err}, \phi_{2,err}) = \arg(w_l^*)$.

Other alternative embodiments can avoid creating an underdetermined system of equations. To do this, a fractionally-spaced set of receive samples may be used, where the fractional spacing is greater than or equal to the number of users to be jointly demodulated. For example, for a fractional sampling rate of two samples per symbol, $y_l$ becomes the vector of receive samples $y_l = [y(lT_s - T_s/2)\ y(lT_s)]$, and $\hat{y}_l$ is now a 2×2 matrix. For the two-user case, a unique solution for the weight vector may be found. Another alternative embodiment to avoid creating an underdetermined system of equations is to consider two symbol-spaced samples at a time, thus performing the AFC update once every two symbols.

Other embodiments may calculate a joint phase error update in a less accurate manner. For example, in an IS-136 equalizer, the value used for the phase error update is the sign of the phase error. Thus, the update to the local AFC has a fixed magnitude, but varies in sign. A similar approach may be used for joint demodulation embodiments. For example, in the two-user case, the pair of phase update values $(\phi_{1,err}, \phi_{2,err})$ could take one of the values belonging to the set $\{(\mu_1, \mu_1), (-\mu_1, \mu_1), (\mu_1, -\mu_1), (-\mu_1, -\mu_1)\}$. The exact value could be chosen by evaluating Equation (10) for each possible value of $(\phi_{1,err}, \phi_{2,err})$ and choosing that pair which minimizes $\gamma$. In another embodiment, the arg( ) function can be replaced by the approximation arg(a*b)= sign(real(a)imag(b)−real(b)imag(a)). To compute $\hat{\phi}_{1,err}$, let a=$\hat{y}_{1,I}$ and b=$y_I-\hat{y}_{2,I}$, and to compute $\hat{\phi}_{2,err}$, let a=$\hat{y}_{2,I}$ and b=$y_I-\hat{y}_{1,I}$.

Finally, neither per-survivor processing nor multiple-survivor MLSE may be required. Rather, one channel model and/or one AFC model may be sufficient for all hypothesized states (paths) in the demodulator. Thus, an alternate embodiment can use one AFC model to compute a single phase error estimate and a single frequency error estimate for all hypothesized states (paths) at each sample time. The same local AFC update approach described previously may be used, but the data used to perform the update may be taken from the best hypothesized state (path). To allow reliable estimates to be computed, a lag between the current receive sample and the sample used for updating the estimates may be present and information saved along the best path may be used in this case.

Figure 13:
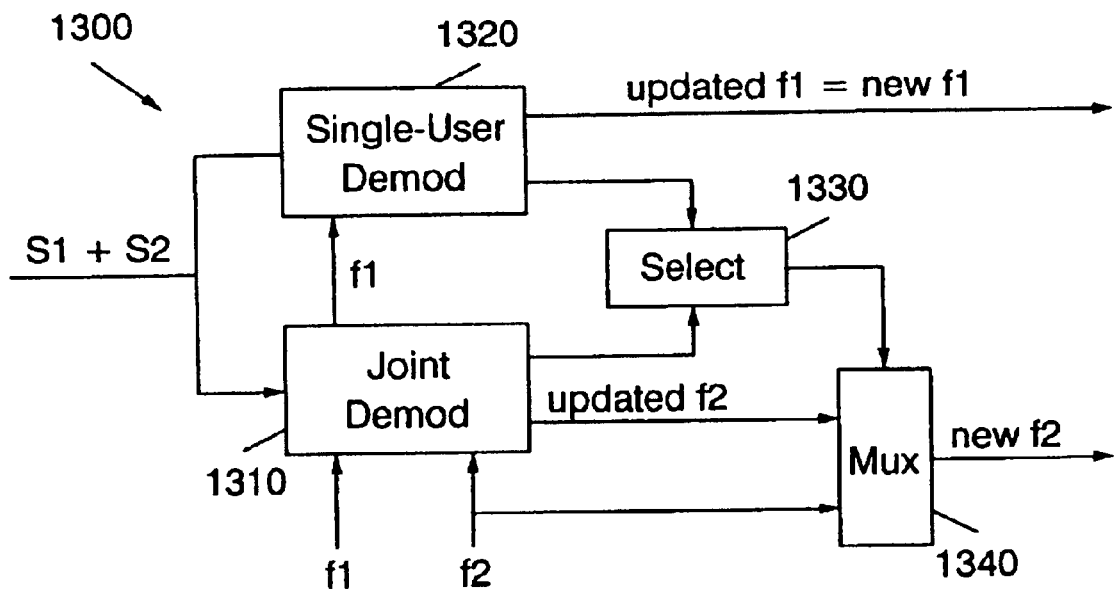
FIGS. 13 and 14 are block diagrams of adaptive demodulation with new frequencies output and with new frequency errors output, respectively, according to embodiments of the present invention.
Figure 14:
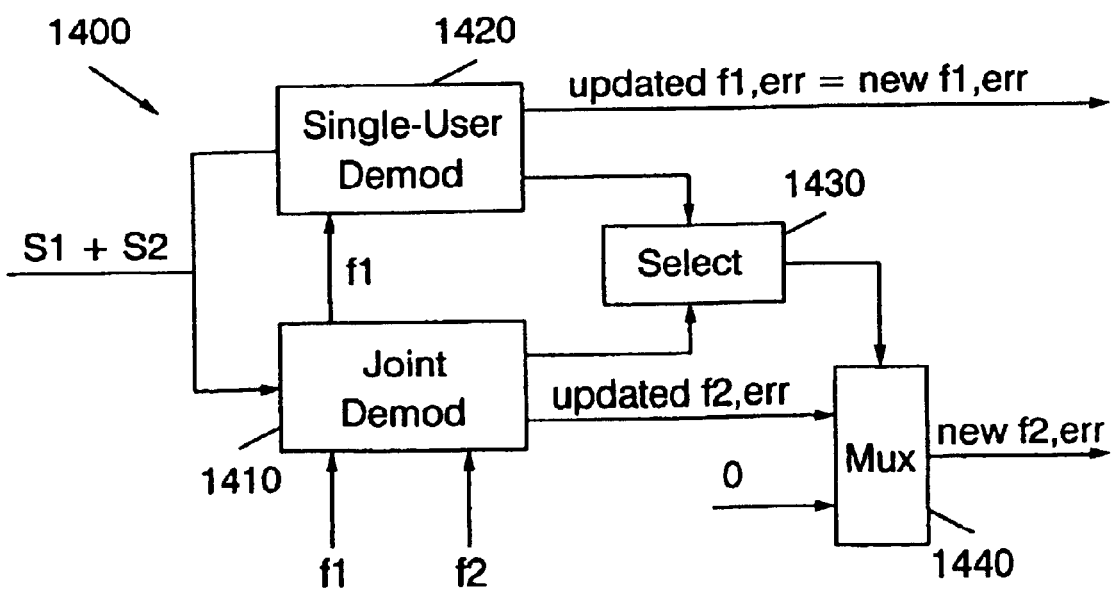

Referring now to FIGS. 13 and 14, embodiments that can perform adaptive demodulation according to the present invention now will be described. As shown in FIG. 13, demodulation systems and methods 1300 include a joint demodulator 1310 as was described above, and also add a single-user demodulator 1320, also referred to as a single-user detector. A selector 1330 selects either the joint demodulator 1310 or the single-user demodulator 1320 for the present slot. Accordingly, adaptive selection between joint demodulation and single user demodulation may be provided.

When joint demodulation is used, the long-term AFC can operate as was already described. When single-user demodulation is selected, there may not be a corresponding frequency update for the interferer, since the single-user demodulator need not demodulate the interferer. In this case, the interferer frequency preferably is maintained constant. In FIG. 13, a multiplexer 1340 is employed to allow the interferer frequency $f_2$ to be maintained constant without being updated. In contrast, in FIG. 14, demodulation systems and methods 1400 also use a single-user demodulator 1420 and joint demodulator 1410, as described above, but output error frequencies. When the selector 1430 selects the single-user demodulation 1420, then the multiplexer 1440 can select a zero input when interference frequency errors are output by the single-user demodulator 1420 and by the joint demodulator 1410.

Figure 15:
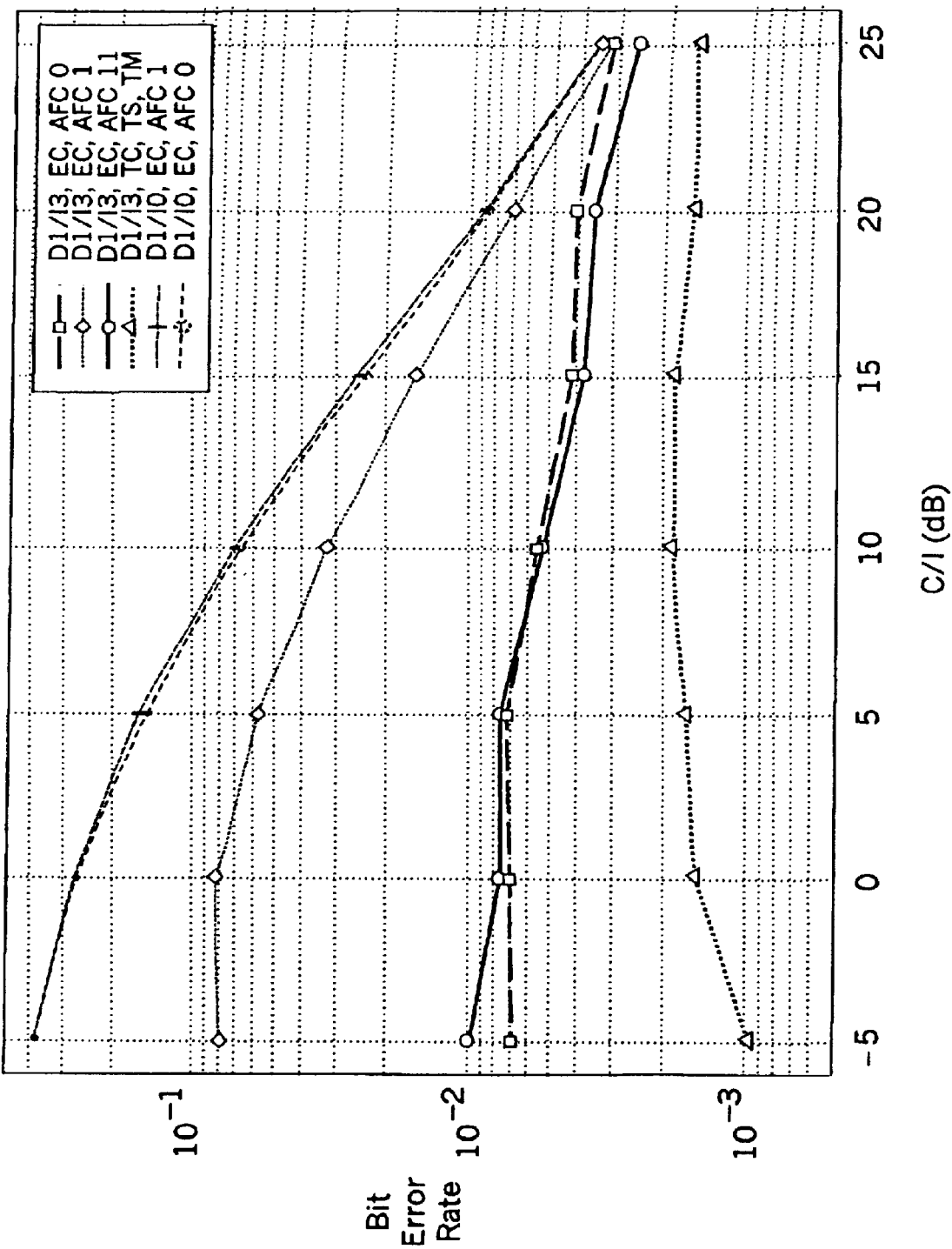
FIG. 15 graphically illustrates simulation results of joint AFC according to embodiments of the present invention.

Simulation results now will be presented for two-user joint demodulation systems and methods according to embodiments of the invention. FIG. 15 shows the performance comparing cases for no AFC, independent AFC and joint AFC when no frequency error exists. These AFC modes are designated as AFC 0, AFC 1 and AFC 11, respectively. Also shown in this plot is a conventional demodulator with and without AFC as well as the performance with known true channel information. The number of taps assigned to the desired and interfering signals is denoted as Dn/Im, so that the conventional demodulator is represented as D1/I0. The joint demodulator uses one desired signal and three interferer taps, and is thus designated as D1/I3. Also designated are whether the channel is assumed known (TC) or estimation is used (EC), sync is known (TS) or estimated (ES), and whether the interferer misalignment is known (TM) or estimated (EM). The actual frequency offset for the desired signal and interferer is labeled as $Df_d/If_i$ in Hz.

FIG. 15 shows that in the case of conventional demodulation, AFC does not degrade performance significantly when there is no frequency offset in the desired signal. However, when joint demodulation is used with independent AFC, severe degradation of AFC performance occurs, although there is still an advantage (≈1 dB at 1% BER) compared to conventional demodulation. Use of joint AFC restores performance to the original results when AFC is not used (and there are no frequency offsets).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A joint demodulation system for demodulating jointly received first and second signals, the joint demodulation system comprising:

a converter that is configured to downconvert the jointly received first and second signals; and a joint demodulator that is responsive to the downconverted jointly received first and second signals, and that is configured to separately generate an estimated first frequency/first frequency error for the downconverted first signal and an estimated second frequency/second frequency error for the downconverted second signal;

wherein the converter is responsive to the estimated first frequency/first frequency error to downconvert the jointly received first and second signals; and wherein the joint demodulator is responsive to a difference between the estimated second frequency/second frequency error and the estimated first frequency/first frequency error to jointly demodulate the downconverted jointly received first and second signals.

2. The system according to claim 1 wherein the joint demodulator assumes that there is no first frequency error.

3. The system according to claim 1 wherein the first signal is a desired signal and wherein the second signal is an interfering signal.

4. The system according to claim 1 further comprising:

a first feedback loop that is coupled between the estimated first frequency/first frequency error and the converter, such that the converter downconverts the jointly received first and second signals based on the estimated first frequency/first frequency error; and a second feedback loop that is coupled between the estimated second frequency/frequency error and the joint demodulator, such that the joint demodulator separately generates the estimated first and second frequency errors based on the estimated second frequency/second frequency error.

5. The system according to claim 4 wherein the joint demodulator includes a first local automatic frequency control system that corrects for frequency offsets in the first signal at a first rate, and wherein the first feedback loop comprises:

a first long term automatic frequency control system that is coupled to the first local automatic frequency control system to correct for frequency offsets in the first signal at a second rate that is lower than the first rate, the first long term automatic frequency control system being coupled to the converter.

6. The system according to claim 4 wherein the joint demodulator includes a second local automatic frequency control system that corrects for frequency offsets in the second signal at a first rate, and wherein the second feedback loop comprises:

a second long term automatic frequency control system that is coupled to the second local automatic frequency control system to correct for frequency offsets in the second signal at a second rate that is lower than the first rate, the second long term automatic frequency control system being coupled to the joint demodulator.

7. The system according to claim 5 wherein the jointly received first and second signals are received over a series of repeating slots and are sampled more than once during each slot, wherein the first rate is once per sample and wherein the second rate is once per slot.

8. The system according to claim 6 wherein the jointly received first and second signals are received over a series of repeating slots and are sampled more than once during each slot, wherein the first rate is once per sample and wherein the second rate is once per slot.

9. The system according to claim 5 wherein the first local automatic frequency control comprises:

a phase error computer that is configured to compute a phase error in the first received signal at the first rate; and a phase lock loop that is responsive to the phase error and is configured to compute a first frequency error therefrom at the first rate.

10. The system according to claim 6 wherein the second local automatic frequency control comprises:

a phase error computer that is configured to compute a phase error in the second received signal at the first rate; and a phase lock loop that is responsive to the phase error and is configured to compute a first frequency error therefrom at the first rate.

11. The system according to claim 9 wherein the first long term automatic frequency control comprises:

a feedback loop that is responsive to the first frequency error and is configured to determine a second frequency error therefrom at the second rate.

12. The system according to claim 10 wherein the second long term automatic frequency control comprises:

a feedback loop that is responsive to the first frequency error and is configured to determine a second frequency error therefrom at the second rate.

13. The system according to claim 1 further comprising:
a single-user demodulator that is responsive to the downconverted jointly received first and second signals, and that is configured to estimate the first frequency error; and
a selector that selects the joint demodulator or the single-user demodulator.

14. The system according to claim 13 wherein the estimated second frequency error is maintained constant when the selector selects the single-user demodulator.

15. A joint demodulation system for demodulating jointly received first and second signals, the joint demodulation system comprising:

a converter that is configured to downconvert the jointly received first and second signals;

a joint demodulator that is responsive to the downconverted jointly received first and second signals, and that is configured to separately generate an estimate of a first frequency/first frequency error for the downconverted first signal and an estimate of a second frequency/second frequency error in the downconverted second signal; and wherein the joint demodulator is responsive to both the estimated second frequency/second frequency error and the estimated first frequency/first frequency error to jointly demodulate the downconverted jointly received first and second signals.

16. A joint demodulation system according to claim 15 further comprising:

a first feedback loop that is coupled between the estimate of a first frequency/first frequency error and the joint demodulator, such that the joint demodulator demodulates the jointly received first and second signals based on the estimate of a first frequency/first frequency error; and a second feedback loop that is coupled between the estimate of the second frequency error and the joint demodulator, such that the joint demodulator also demodulates the jointly received first and second signals based on the estimate of the second frequency/second frequency error.

17. The system according to claim 15 wherein the first signal is a desired signal and wherein the second signal is an interfering signal.

18. The system according to claim 16 wherein the joint demodulator includes a first local automatic frequency control system that corrects for frequency offsets in the first signal at a first rate, and wherein the first feedback loop comprises:

a first long term automatic frequency control system that is coupled to the first local automatic frequency control system to correct for frequency offsets in the first signal at a second rate that is lower than the first rate, the first long term automatic frequency control system being coupled to the joint demodulator.

19. The system according to claim 16 wherein the joint demodulator includes a second local automatic frequency control system that corrects for frequency offsets in the second signal at a first rate, and wherein the second feedback loop comprises:

a second long term automatic frequency control system that is coupled to the second local automatic frequency control system to correct for frequency offsets in the second signal at a second rate that is lower than the first rate, the second long term automatic frequency control system being coupled to the joint demodulator.

20. The system according to claim 18 wherein the jointly received first and second signals are received over a series of repeating slots and are sampled more than once during each slot, wherein the first rate is once per sample and wherein the second rate is once per slot.

21. The system according to claim 19 wherein the jointly received first and second signals are received over a series of repeating slots and are sampled more than once during each slot, wherein the first rate is once per sample and wherein the second rate is once per slot.

22. The system according to claim 18 wherein the first local automatic frequency control comprises:
- a phase error computer that is configured to compute a phase error in the first received signal at the first rate; and
- a phase lock loop that is responsive to the phase error and is configured to compute a first frequency error therefrom at the first rate.

23. The system according to claim 19 wherein the second local automatic frequency control comprises:
- a phase error computer that is configured to compute a phase error in the second received signal at the first rate; and
- a phase lock loop that is responsive to the phase error to compute a first frequency error therefrom at the first rate.

24. The system according to claim 22 wherein the first long term automatic frequency control comprises:
- a feedback loop that is responsive to the first frequency error and is configured to determine a second frequency error therefrom at the second rate.

25. The system according to claim 23 wherein the second long term automatic frequency control comprises:
- a feedback loop that is responsive to the first frequency error to determine a second frequency error therefrom at the second rate.

26. The system according to claim 15 further comprising:
- a single-user demodulator that is responsive to the downconverted jointly received first and second signals, and that is configured to provide the estimate of the first frequency/first frequency error; and
- a selector that selects the joint demodulator or the single-user demodulator.

27. The system according to claim 26 wherein the second feedback loop maintains the estimate of the second frequency error constant when the selector selects the single-user demodulator.

28. A demodulation system for jointly received first and second signals, comprising:
- a joint demodulator that is configured to generate an estimated first frequency/first frequency error for the first signal and an estimated second frequency/second frequency error for the second signal;
- a first long term automatic frequency control that is responsive to the estimated first frequency/first frequency error, wherein the joint demodulator is responsive to the first long term automatic frequency control; and
- a second long term automatic frequency control that is responsive to the estimated second frequency/second frequency error, wherein the joint demodulator is responsive to the second long term automatic frequency control.

29. The system according to claim 28 further comprising:
- a subtractor that is responsive to the first and second and second automatic frequency controls, wherein the joint demodulator is responsive to the subtractor.

30. The system according to claim 28 further comprising:
- a converter that is configured to downconvert the jointly received first and second signals;
- wherein the joint demodulator that is responsive to the downconverted jointly received first and second signals; and
- wherein the converter also is responsive to the first long term automatic frequency control.

31. The system according to claim 28 wherein the first signal is a desired signal and wherein the second signal is an interfering signal.

32. The system according to claim 28 wherein the joint demodulator includes a first local automatic frequency control that corrects for frequency offsets in the first signal at a first rate, and wherein the first long term automatic frequency control is coupled to the first local automatic frequency control to correct for frequency offsets in the first signal at a second rate that is lower than the first rate.

33. The system according to claim 28 wherein the joint demodulator includes a second local automatic frequency control that corrects for frequency offsets in the second signal at a first rate, and wherein the second long term automatic frequency control is coupled to the second local automatic frequency control to correct for frequency offsets in the second signal at a second rate that is lower than the first rate.

34. The system according to claim 32 wherein the jointly received first and second signals are received over a series of repeating slots and are sampled more than once during each slot, wherein the first rate is once per sample and wherein the second rate is once per slot.

35. A joint demodulation method for demodulating jointly received first and second signals, the joint demodulation method comprising:
- downconverting the jointly received first and second signals; and
- separately generating an estimated first frequency/first frequency error for the downconverted first signal and an estimated second frequency/second frequency error for the downconverted second signal;
- wherein the downconverting the jointly received first and second signals is responsive to the estimated first frequency/first frequency error; and
- wherein the separately generating an estimated first frequency/first frequency error for the downconverted first signal and an estimated second frequency/second frequency error for the downconverted second signal is responsive to a difference between the estimated second frequency/second frequency error and the estimated first frequency/first frequency error.

36. The method according to claim 35 wherein the first signal is a desired signal and wherein the second signal is an interfering signal.

37. The method according to claim 35 wherein the separately generating an estimated first frequency/first frequency error for the downconverted first signal and an estimated second frequency/second frequency error for the downconverted second signal comprises:
- correcting for frequency offsets in the first signal at a first rate; and
- correcting for frequency offsets in the frequency offset corrected first signal at a second rate that is lower than the first rate, to thereby estimate the first frequency/first frequency error.

38. The method according to claim 35 wherein the separately generating an estimated first frequency/first frequency error for the downconverted first signal and an estimated second frequency/second frequency error for the downconverted second signal comprises:
- correcting for frequency offsets in the second signal at a first rate; and
- correcting for frequency offsets in the frequency offset corrected second signal at a second rate that is lower than the first rate, to thereby estimate the second frequency/second frequency error.

39. The method according to claim 38 wherein the jointly received first and second signals are received over a series of repeating slots and are sampled more than once during each slot, wherein the first rate is once per sample and wherein the second rate is once per slot.

40. The method according to claim 37 wherein the correcting for frequency offsets in the first signal at a first rate comprises:

computing a phase error in the first received signal at the first rate; and computing a first frequency error therefrom at the first rate.

41. The method according to claim 35 further comprising:

estimating the first frequency error in the downconverted first signal; and selectively performing the separately generating an estimated first frequency/first frequency error for the downconverted first signal and an estimated second frequency/second frequency error for the downconverted second signal or the estimating the first frequency error in the downconverted first signal.

42. The method according to claim 41 further comprising maintaining the estimated second frequency/second frequency error constant in response to the selectively performing the estimating the first frequency error in the downconverted first signal.

43. A joint demodulation method for demodulating jointly received first and second signals, the joint demodulation method comprising:

downconverting the jointly received first and second signals;

separately generating an estimate of a first frequency/first frequency error for the downconverted first signal and an estimate of a second frequency/second frequency error in the downconverted second signal;

wherein the separately generating an estimated first frequency/first frequency error for the downconverted first signal and an estimated second frequency/second frequency error for the downconverted second signal is responsive to both the estimated second frequency/second frequency error and the estimated first frequency/first frequency error.

44. The method according to claim 43 wherein the first signal is a desired signal and wherein the second signal is an interfering signal.

* * * * *